United States Patent [19]

Stone et al.

[11] Patent Number: 5,777,841
[45] Date of Patent: Jul. 7, 1998

[54] METHOD OF QUALIFICATION TESTING OF DC-DC CONVERTERS

[75] Inventors: Kevin Patrick Stone; Ken David Ellacott, both of Nepean, Canada

[73] Assignee: Northern Telecom Limited, Monteal, Canada

[21] Appl. No.: 813,263

[22] Filed: Mar. 7, 1997

[51] Int. Cl.$^6$ ............................................. G06F 15/00
[52] U.S. Cl. .................... 364/554; 364/483; 364/487; 364/551.01; 379/29
[58] Field of Search ...................... 364/554, 481, 364/487, 557.01, 483; 324/102, 74; 323/268, 259, 285; 371/15.1, 16.1, 22.1; 379/29, 27

[56] References Cited

U.S. PATENT DOCUMENTS

| | | | |
|---|---|---|---|
| 4,932,075 | 6/1990 | Dimitrijevic et al. | 455/226 |
| 5,390,129 | 2/1995 | Rhodes | 364/480 |
| 5,414,341 | 5/1995 | Brown | 323/268 |
| 5,470,341 | 11/1995 | Thakore et al. | 364/551.01 |

OTHER PUBLICATIONS

Motorola University, May 1990, entitled "Six Sigma Producibility Analysis and Process Characterization" by Mikel J. Harry and J. Ronald Lawson.

Abstract, Ellacott, Ken "Qualification testing of DC–DC converters"; Proceedings of the 1997 IEEE 12th Applied Power Electronics Conference, APEC 97, Feb. 23, 1997.

Abstract by Ellacott, Ken "Practical test method for DC–DC Converter qualification", Proceedings of 1996 IEEE 46th Electronic Components & Technology Conference, ECTC May 28, 1996.

*Primary Examiner*—Hezron E. Williams
*Assistant Examiner*—Shah Kamonis
*Attorney, Agent, or Firm*—John Granchelli

[57] ABSTRACT

DC—DC power converters are an integral and critical component of telecommunications products. As a key component, the reliability of these devices has direct impact on quality of the products. Many of the converters utilized in telecommunications products are standard "off the shelf" commercial units, available from a wide variety of suppliers. With the recent proliferation of the use of these devices, former qualification methods had proven incapable of assuring the quality and reliability requirements for a telecom environment. Disclosed is the current setup, test, statistical analysis and failure analysis methods used to assess DC—DC power converter design quality and reliability.

12 Claims, 8 Drawing Sheets

– Max Vin\Min Load
-□- Max Vin\Max Load
– Nom Vin\Min Load
-◇- Nom Vin\Max Load
– Min Vin\Min Load
-△- Min Vin\Max Load

METHOD OF QUALIFICATION TESTING OF DC-DC CONVERTERS

TECHNICAL FIELD

The present invention relates to a method of qualification testing of DC—DC converters.

BACKGROUND INFORMATION

DC—DC converters, which are an integral and critical component of the telecommunications products, are the key interface between the incoming battery feed voltage and the complex electronics that make up today's telecommunication products. Reliable converters are necessary to ensure the lowest cost of system maintenance and the least possible customer service impact in the telecommunications environment. Many of the DC—DC converters utilized in the telecommunications products are standard commercial units, available from a wide variety of suppliers.

The selection of original equipment manufactured (OEM) devices such as DC—DC converters was based on suitability to the desired application. Qualification was granted based on data provided by the supplier which showed evidence that the device in question would comply to the specifications of the product manufacturer. Variables that can influence reliability, but were not assessed in an early approach, include component tolerance variation, design fault, manufacturing process control and human error. DC—DC converter reliability has long been an issue of concern at manufacturers of telecommunication products. Significant numbers of system failures, both in manufacturing and in the field, are due to failures of these devices. In response to these failures, a process to evaluate and qualify DC—DC converters is necessary.

SUMMARY OF THE INVENTION

It is an object of the present invention to provide an improved method of qualification testing of DC—DC converters.

According to one aspect of the present invention, there is provided a method of qualification testing of a group of DC—DC converters, comprising the steps of: (1) testing operation performance of all of the DC—DC converters in the group, under condition of normal temperature; (2) testing thermal coefficients of expansion of a certain number of the DC—DC converters tested at step (1), upon application of thermal shock; (3) testing functionality of a certain number of the DC—DC converters tested at step (2), upon application of power and thermal cycling; (4) testing design margin of a certain number of the DC—DC converters tested at step (2), under step changes in temperature; and (5) performing analysis using capability ratios to determine whether the failures of the group of the DC—DC converters are failed to be qualified, on the basis of short term and mid term capability ratios which are defined by upper and lower specification limits, mean and standard deviation.

An example of step (5) comprises the step of determining if the mid term capability ratio is less than a predetermined value, the group of the DC—DC converters will be failed. For example, the predetermined value of the mid term capability ratio is 1.33. The mid term capability ratio Cpk is given by:

$$Cpk = \min[(USL-\mu/3\sigma), (\mu-LSL/3\sigma)]$$

where, USL, LSL, $\mu$ and $\sigma$ are the upper specification limit, the lower specification limit, the mean and the standard deviation, respectively.

With the failure analysis, the design quality and reliability of the DC—DC converters are assessed.

BRIEF DESCRIPTION OF THE DRAWINGS

An embodiment of the present invention will now be described by way of example with reference to the accompanying drawings in which.

DETAILED DESCRIPTION

Environmental stress, coupled with detailed measurement and analysis of key parametric data are used in a systematic approach to identifying latent defects related to design, component selection or manufacturing process. By applying stress to the device, one of three results is achieved: 1) the device is unchanged and undamaged and therefore considered acceptable; 2) the device fails altogether; or 3) a latent fault is precipitated that may be detected through detailed measurement and analysis of parametric data.

The theory behind the qualification process for DC—DC converters is basic: derive a performance baseline, apply stress, re-measure performance, analyze for shifts, and finally conduct full root cause analysis on any unit which exhibits suspect performance. Although simple in theory, implementation of this process on a consistent and accurate basis brings forward certain requirements:

(i) flexible fixturing platform to deal with various mechanical and electrical configurations;

(ii) short overall cycle time to satisfy tight design schedules;

(iii) highly accurate and repeatable measurements;

(iv) electronic data gathering;

(v) ability to detect fine shifts in operating performance through detailed statistical analysis; and (vi) provide a common basis for comparison of devices from various suppliers.

The methods used to mechanically connect to the devices, and to control all associated test equipment formed the foundation for the qualification program. The ability of subsequent data analysis to detect anomalous results would be limited unless measured data was extremely accurate and repeatable. Issues such as cost, throughput and flexibility are directly related to the test setup as well.

I. Fixturing

The fixturing method had to mesh the requirements of the qualification program with the generic characteristics of DC—DC converters as listed below.

DC—DC Converter Generic Features typically 48 VDC input voltage;

single, dual or triple output;
up to 100 watts output power;
FR4, ceramic, or bonded metal clad substrate material; direct circuit board mounting; and
potted or non-potted.

Qualification Program Common Requirements
multiple test configurations required for the same unit;
accurate voltage and current measurements;
minimum re-work for each new device type; and
multiple units under simultaneous test.

Figure 1:
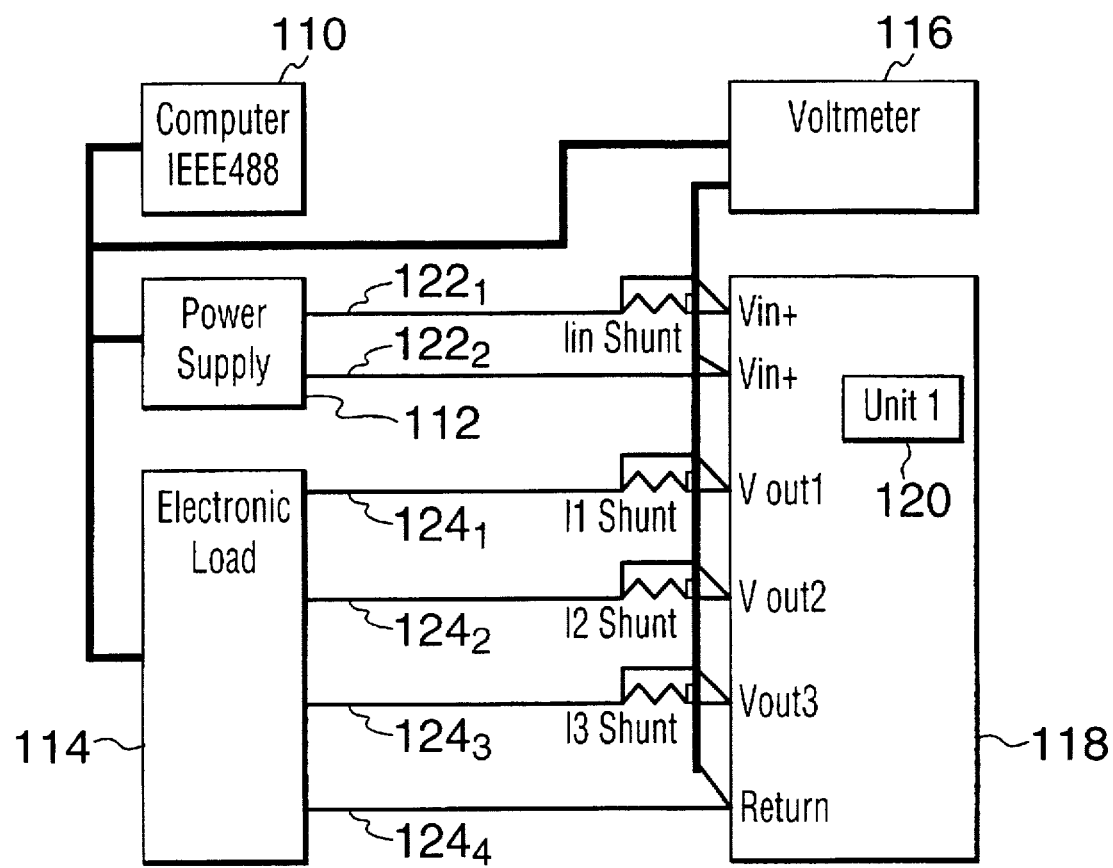
FIG. 1 is a block diagram of a characterization test platform.

Based on these requirements, a fixturing platform using a mother board/daughter board arrangement was developed. FIG. 1 illustrates the typical implementation of fixturing for room temperature characterization. In FIG. 1, a computer 110 is HP (trademark) 3000, a power supply 112 is HP 6655A, an electronic load 114 is HP 6050A and a multi-channel digital voltmeter 116 is Fluke (trademark) Data Bucket. A mother board 118 is arranged with a daughter board 120. Similar approaches are used for all other required test platforms.

The daughter board 120 is designed for each new DC—DC converter footprint. One converter is wave soldered directly to each board, ensuring reliable connection to the device terminals. Input and output connections to the daughter board 120 are made through high current capacity connectors. It is assumed that all types of DC—DC converters have one primary output which will deliver a higher current output relative to the other two outputs (for triple output types). Since voltage loss in the primary output load path can be significant due to the high current in the higher wattage devices, provision was made for isolated voltage measurement sense lines to be brought directly up to the primary output terminals of the converter through separate connector pins. These sense lines allow voltage measurements to be made at the terminal pins of the device, ensuring highly accurate and repeatable data. Measurements of the input voltage line and auxiliary output voltage lines are sensed on the mother board side of the connector, since the currents in these lines $122_1$, $122_2$; and $124_1$-$124_4$ are significantly lower than the primary output.

The mother board 118 is designed to accommodate up to five daughter boards. Each of the five positions provide connection points for 3 separate loads. Voltage measurement sense lines for the all 3 output voltages and input voltage are fed to a separate connector on segregated lines, again to eliminate any voltage drop effects. The mother board wiring and setup can be customized to any specific test set up. Typically the mother board 118 is connected to the electronic load 114 and the power supply 112, with all input and output currents measured through series current shunts. The shunts and voltage sense lines $122_1$, $122_2$; and $124_1$-$124_4$ from the mother board 118 are monitored through the multi-channel digital voltmeter 116, which serves as the data recording device as well. Using the method, a stable, accurate and flexible fixturing platform is achieved.

II. Automation

Programmable test equipment is used under computer control to set the required line and load conditions for any particular test condition and to record the required measurements. An automated test sequence is important for a number of reasons. Timing is critical when attempting to gather consistent parametric data. DC—DC converters can dissipate considerable heat at full load conditions. Control components within the devices heat up, causing subtle changes in operating characteristics. To eliminate, or at least reduce the effect this variable has on the relative consistency of repeated measurements, time under test must be identical for all devices at all times. Secondly, a large quantity of data is collected due to the number of parameters that must be monitored, and the number of units under test. This data must be electronically tabulated for analysis purposes. Automated data collection provides a practical method to gather this information. And thirdly, speed of implementation, and accuracy of the test equipment settings is maintained automatically by using computers to set all required test conditions.

III. Test Process

Figure 2:
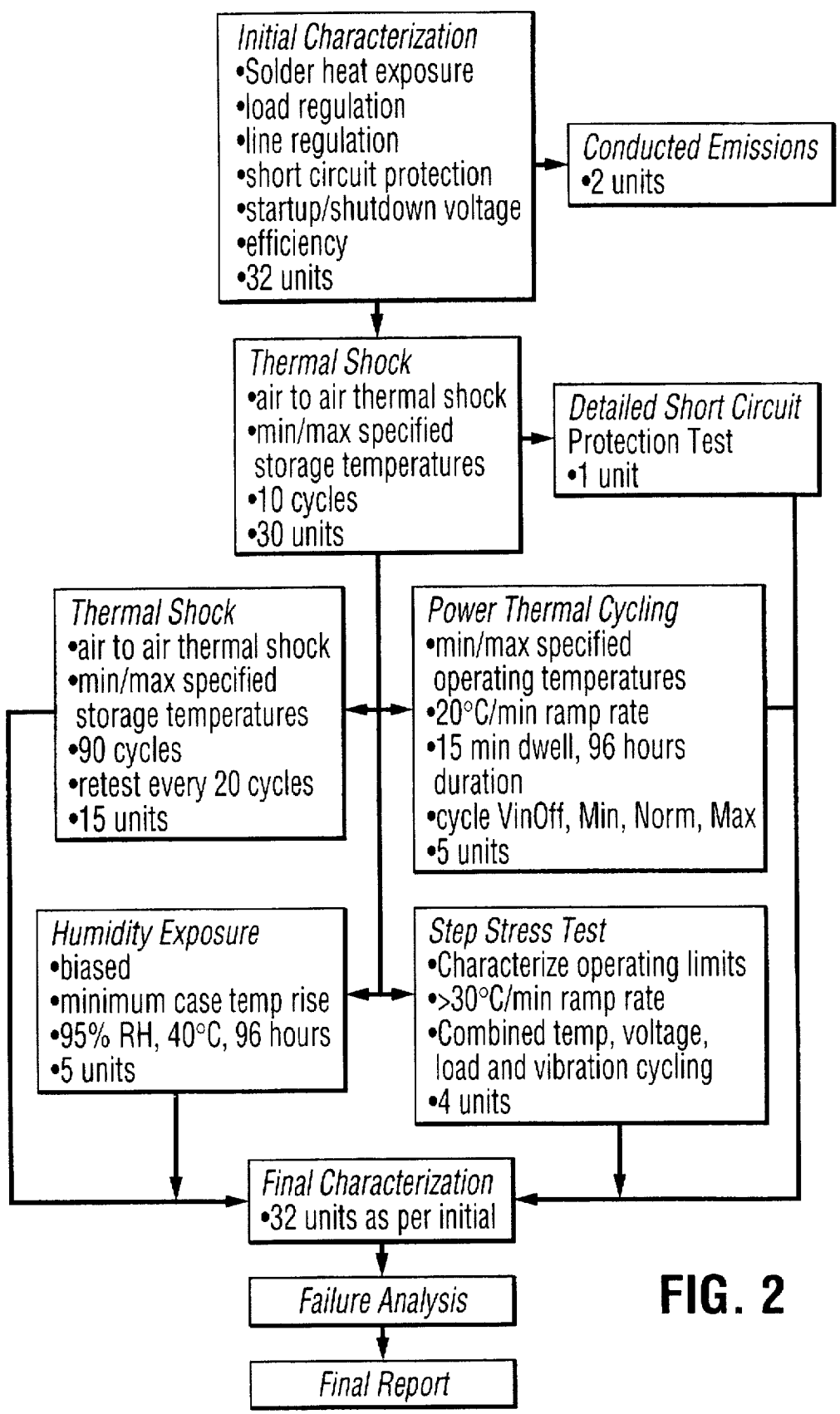
FIG. 2 illustrates a standard test process.

FIG. 2 shows the standard test plan developed for the qualification of DC—DC converters. The plan is based on 32 samples, for example, which flow through various test streams. The test process has evolved over time to address not only the application of environmental stresses as a means to identify latent defects, but also to verify operation of the device in accordance with specifications. The practical implementation of this process has certain limitations. Ideally, for statistical validity, sample size should be larger. However, individual device cost and the impracticality of processing a larger sample size is prohibitive. In addition, only the key parameters are measured throughout the program. In order to measure every possible operational parameter (i.e., line and load transient response), time to implement the program would increase from weeks to months.

The selection of environmental stresses applied to the DC—DC converters was governed primarily by their effectiveness at revealing latent defects in a relatively short period of time. These defects had to be representative of problems that would actually occur in manufacturing, test, or in the field. It is critical to ensure that the applied stresses do not introduce false failures by causing damage to good devices. To ensure the validity of any failures which may occur, all environmental stresses are conducted within the operating specifications of the device, with the exception of step stress testing which explores operational margin above and below the rated limits of the device. Since step stress testing will often exceed the destruct limits of the device, failures are expected. These failures are analyzed to learn what, if any improvements can be made to improve the robustness of the device. Table I offers a summary of the types of defects uncovered using the applied stresses discussed below.

TABLE I

Types of Defects Detected vs. Applied Stresses

| Defect or Root Cause | Thermal Shock | Power/ Thermal Cycling | Step Stress Test | Biased Humidity |
|---|---|---|---|---|
| Performance specification drift | X | X | X | X |
| Insufficient solder pad size | X | X | | |
| Partially nicked transformer wires | X | X | X | |
| Incorrect temp range components | | X | X | |
| Poor soldering caused by heat sinking | X | X | | |
| Improper sized conductors | | X | X | |
| Poor solder paste application | X | X | | |
| Ionic contamination | | X | | X |
| Poor electrical design practices | | X | X | |
| Improper mechanical fastening | X | X | X | |
| Improper wire bonding process | X | X | X | |
| Defective components | X | X | X | X |
| Cold solder joints | X | X | X | |
| Insufficient design margin | | X | X | |
| Improper component voltage rating | | X | X | |

TABLE I-continued

Types of Defects Detected vs. Applied Stresses

| Defect or Root Cause | Thermal Shock | Power/ Thermal Cycling | Step Stress Test | Biased Humidity |
|---|---|---|---|---|
| Excessive output noise | | | X | |
| Improper part placement | X | X | X | |

Referring to FIG. 2, each test of the test plan will be described below.

A. Initial Characterization Test

The devices to be tested are mounted to test cards and exposed to a standard wave solder process. This eases the assembly operation, but more importantly reproduces the thermal shock the devices would see in a typical manufacturing process. An initial room temperature characterization is then performed an all samples. This derives the initial baseline data that will be used for comparative analysis, and also verifies "out of the box" performance. Failures have been encountered at this early stage, whether due to the wave solder stress or due to a non functional unit shipped from the supplier. Room temperature characterization is repeated at various points in the test process in order to test for non functional devices and to obtain additional data which will be used in the analysis process.

B. Thermal Shock Test

Thermal shock is applied to unpowered units using an air-to-air elevator style environmental chamber. This style of chamber has long been used to perform MIL STD 202 type thermal cycling on integrated circuits. The specified storage temperature limits of the device are used to derive the upper and lower limits of this test. The objective of this test is to induce the maximum possible change in temperature and rate of change of temperature on the devices under test (DUT). The fact that materials such as fiberglass, plastics, solder, copper, aluminum and glass used in construction of the DC—DC converters will have different thermal coefficients of expansion (TCEs), can be exploited using thermal shock to precipitate defects. Repetitive cycling between temperature extremes will maximize the relative expansion and contraction between these different material interfaces. Poor solder adhesion, improper wire bonding and other types of material interface defects are quickly revealed using this technique.

C. Power/Thermal Cycling Test

Figure 3:
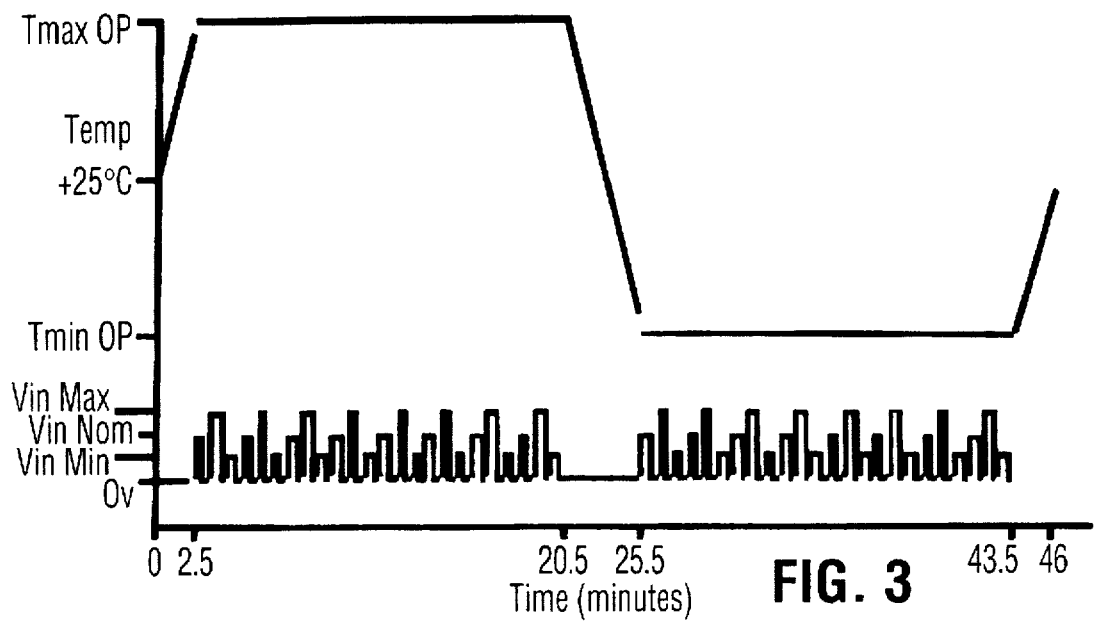
FIG. 3 illustrates a typical power/thermal cycle.

A combination of input power cycling and thermal cycling will accelerate defects that would not be found by thermal shock alone. Thermal shock is applied on unpowered devices, therefore certain defects that can only be revealed by a powered test can be missed. FIG. 3 illustrates a typical power/thermal power cycle. Limits of temperature and voltage applied during the power/thermal cycling test are determined based on the published performance specifications of the supplier. Case operating temperatures are varied between the published upper and lower operating temperature limits. Input voltages are varied between minimum, maximum, nominal and zero. Typically, each temperature plateau is 20 minutes long, and power is cycled on and off at a rate of 60 seconds. These times are chosen to allow sufficient equalization time at the temperature plateaus, while maximizing the number of power cycles applied.

Powering the device introduces a current inrush stress and voltage stress, and verifies operation at the combined extremes of temperature, input voltage and output load. These additional stresses reveal functional defects. Typical problems found during power/thermal cycling include failure to startup, output voltage drift, and inability to withstand multiple inrush current surges. These problems relate to poor design margins and limitations with component derating for temperature, current or voltage.

D. Humidity Exposure Test

Biased humidity is used to verify the absence of corrosive fluxes or other contaminants introduced during the manufacturing process. This is especially important for potted devices. Potting can be used to hide various manufacturing flaws, such as poor workmanship or process flaws. To check for such flaws, the devices are initially soaked for 24 hours in an unpowered mode. Maximum voltage is then applied on a cycled basis, 10 seconds on, 10 seconds off. The output is loaded to the absolute minimum amount required to keep the converter in stable operation. These test parameters are designed to prevent or minimize self heating of the converters so that local moisture does not burn off. Failures typically manifest as minor changes in input current, either during the exposure or afterwards at room temperature characterization.

E. Step Stress Test

Step stress testing uncovers limitations in design, workmanship, component selection and operational margins that are often missed by other evaluation methods. Verification of design margin ensures that the device will be able to withstand the normal manufacturing process fluctuations, component tolerance variations, component substitutions and staff training variables that occur in a manufacturing environment. At the same time it ensures the device meets and in some cases exceeds its specified requirements and remains reliable. The process involves subjecting the device t o increasing environmental and electrical stresses, up to the limits of the technology. A limit of technology is defined as a parameter that will cause failure once exceeded, such as the maximum junction temperature of a power semiconductor.

Figure 4:
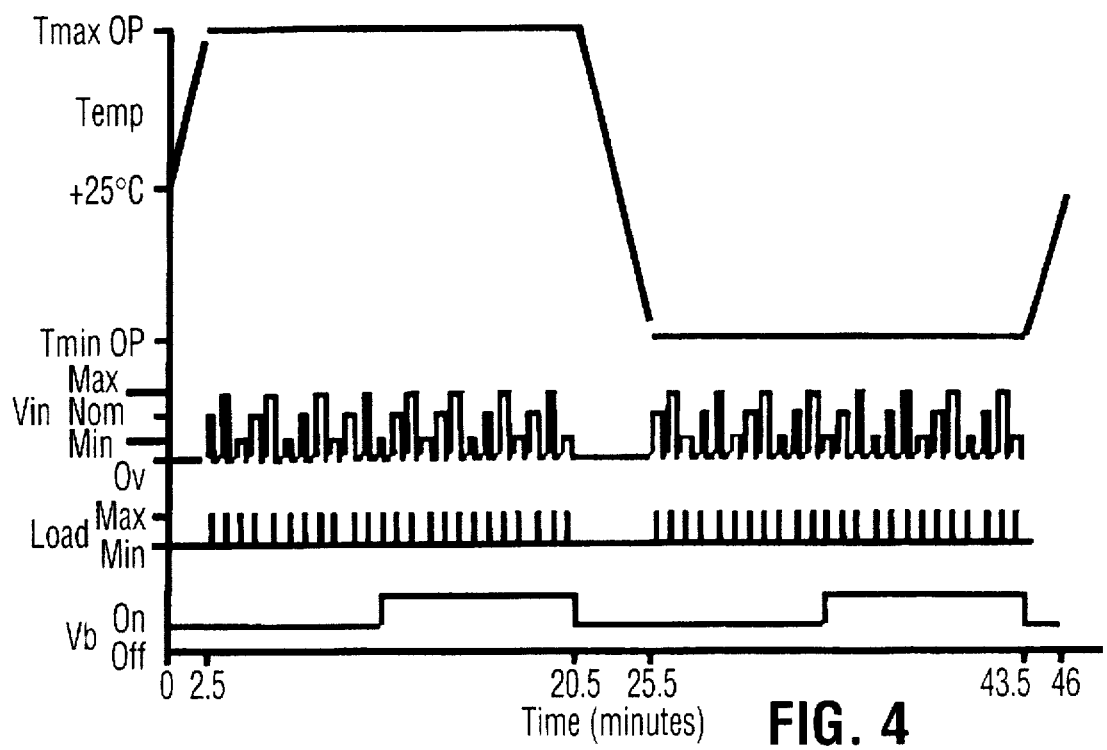
FIG. 4 illustrates a typical step stress cycle.

Step stressing begins by ex posing the device to step changes in temperature from ambient up to and beyond the specified operating limits of the device. At each step the same parameters tested during room temperature characterization are monitored. Cold operation is tested, then hot, up to the point where the device is no longer operating correctly or has failed altogether. Once temperature operating limits have been evaluated, the stresses of random vibration, rapid thermal cycling and input power cycling are combined in a simultaneous fashion to accumulate a level of repetitive fatigue on the device (FIG. 4). As in power/thermal cycling, each temperature plateau is 20 minutes long, and power is cycled on and off at a rate of 60 seconds. Output load is alternated between minimum and maximum every 30 seconds. Vibration is applied for 10 minutes at each temperature plateau. The combination of these stresses will often precipitate hidden flaws that might go undetected under single-stress applications.

F. Conducted Emissions Test

RF and audio rangee missions conducted back to input supply are measured. These measurements do not relate to reliability or robustness, but are important to obtain early in the system design cycle. Conducted emissions of the converter must be known, so that proper filtering can be incorporated into the system design where the converter is to be used. If characterization for conducted emissions was left to the final stage, the system may fail to meet certain regulatory requirements, resulting in costly time delays and redesign. The qualification stage is an ideal point to gather the required data, which can be fed to system designers.

G. Detailed Short Circuit Protection Test

A detailed examination of the short circuit protection of the device is performed to verify that such things as thermal runaway or catastrophic failure do not occur. This test differs from the short circuit protection test conducted during characterization, which only verifies that the device remains undamaged under a short circuit condition. The detailed test more closely examines through observation and measurement the various characteristics of the device under a long term short condition. This test takes significantly longer to apply than the characterization test, and so is conducted separately.

IV. Failure Detection

Failures can manifest in number of ways. For example, there are catastrophic failures, where a device is no longer functional; or failures which are detected through the in-process monitoring of the device, such as a voltage drift or failure to re-start at temperature extremes. These failures are easily detected through observation. However, more subtle faults may be indicated by small shifts in parametric data. The shift may be so minor that the particular parameter in question can still appear to be within specification. These faults are termed soft failures, and are detected through analysis of the data using a number of methods. Several of the analysis techniques discussed in this section provide overlapping results. This is considered necessary to corroborate findings. Since the faults that are being detected are the outcome of very minor parametric shifts, more than one analysis approach provides greater confidence. This is especially important when raising issues based on data that may still be within specification.

Figure 5:
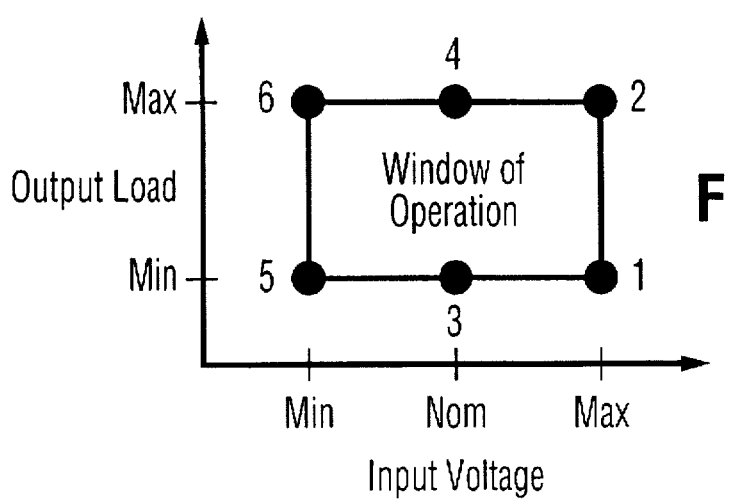
FIG. 5 illustrates key characterization measurement points.

Before, during and after environmental stress exposure, each of the 32 samples are characterized at room temperature. This tests the response of the devices for all critical functions, at all possible conditions of input voltage and output load. The most useful data gained from these tests are input current and output voltage, which are the key operational variables (since input voltage and output current are defined by the test condition). From these values, efficiency is calculated as well. Therefore, six values for input current, output voltage and efficiency are derived for each of the 32 test samples during each characterization, as illustrated in FIG. 5.

All characterization data is tabulated into tables specific to each test condition. A typical analysis spreadsheet for a single output device contains 23 tables; 6 each for efficiency, input current, output voltage, and 5 additional tables for startup voltage, shutdown voltage, short circuit protection, and line/load regulation. A typical table of data is represented in Table II.

TABLE II

Typical Data Table

| Unit # | Test 1 | Test 2 | Test 3 | etc | Mean | σ |
|---|---|---|---|---|---|---|
| 1 | Val__1.1 | Val__1.2 | Val__1.3 |  | $x_a$ | $x_b$ |
| 2 | Val__2.1 | Val__2.2 | Val__2.3 |  | $x_a$ | $x_b$ |
| 3 | Val__3.1 | Val__3.2 | Val__3.3 |  | $x_a$ | $x_b$ |
| ↓ | ↓ | ↓ | ↓ | ↓ | ↓ | ↓ |
| 32 | Val__32.1 | Val__32.2 | Val__32.3 | ?? | $x_a$ | $x_b$ |
| Mean | y | y | y | y |  |  |
| σ | y | y | y | y |  |  |
| $C_p$ | $y_a$ | $y_a$ | $y_a$ | $y_a$ |  |  |
| $C_{pk}$ | $y_b$ | $y_b$ | $y_b$ | $y_b$ |  |  |

The data is analyzed in two ways; looking across at the variation of repeated measurements for the same sample number (x), and looking down at the distribution of measurements relative to the complete sample lot (y). The desired outcome of all analysis is the same, to highlight any device which has undergone a shift in operating parameters.

A. Distribution Analysis

A great deal of insight can be gained by analyzing unit to unit distribution for the same measured parameter over subsequent tests. This analysis is performed using capability ratio [M. Harry and J. Lawson, "Six Sigma Producibility Analysis and Process Characterization", Motorola Inc., May 1990, pp. 5-11–5-14]. It is expected that a group of similar devices, from the same production run, should achieve a tight distribution for the same measured parameter. The specifications of the product manufacturer call for a minimum mid term capability ratio Cpk of 1.33 for key parameters such as output voltage and efficiency. Two values are calculated, short term and mid term capability ratios Cp and Cpk. The short term capability ratio Cp and the mid term capability ratio Cpk are statistical representations of the capability of any given process (i.e., the actual measured distribution) relative to the specified or calculated limits (i.e., the mean, upper and lower specification limits). The short term capability ratio Cp is the ratio of the measured distribution relative to the specification width. The mid term capability ratio Cpk is an indication (expressed as a ratio) of the centering of data relative the specified mean value. The short term capability ratio Cp and the mid term capability ratio Cpk are determined using the following formulas:

$$Cp=(USL-LSL)/(6\sigma)$$

$$Cpk=\min[(USL-\mu/3\sigma), (\mu-LSL/3\sigma)]$$

where;

USL=upper specification limit

LSL=lower specification limit

μ=mean

σ=standard deviation

Figure 6:
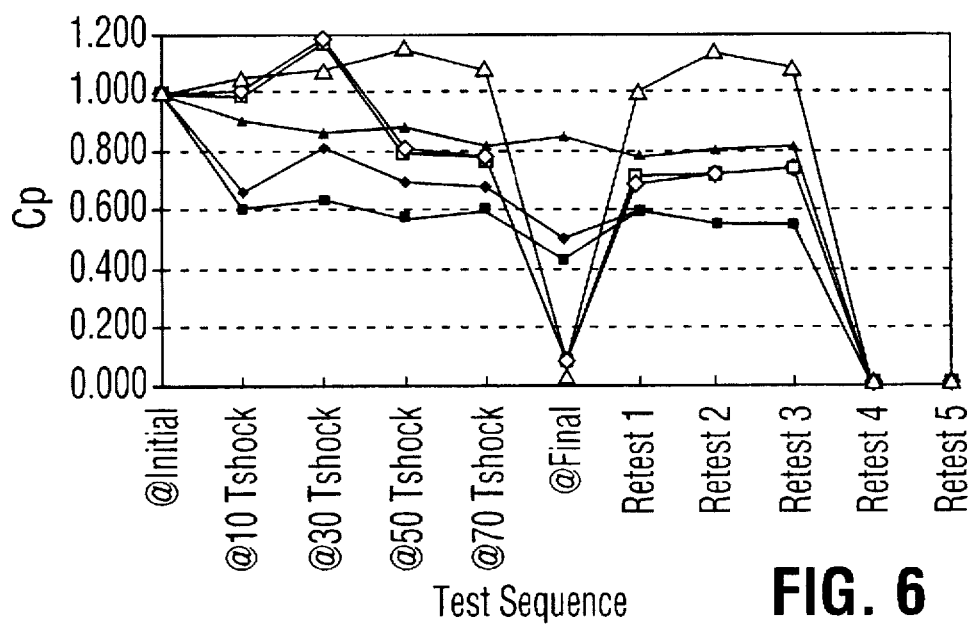
FIG. 6 illustrates examples of short term capability ratio Cp summary.

The mid term capability ratio Cpk (Ya in Table II) provides an indicator of the spread of data relative to a given set of upper and lower limits and is useful for determining if any shifts have taken place during the test program. This would be indicated by a drop in value for short term capability ratio Cp relative to the initial value. The mid term capability ratio Cpk (Yb in Table II) provides an indicator of how well centered the data is to a nominal mean value and indicates things such as poor design centering, lack of process control, poor quality components, or that some critical parameter has changed over the course of testing. A high value for the short term and mid term capability ratios Cp and Cpk indicates that all devices were initially well centered to the nominal mean value, and that the distribution was tight. This provides insight into the design and manufacturing processes of the supplier even before the evaluation exercise begins. Secondly, it quickly illustrates that some factor has changed during the testing process which has caused the capability ratio to drop. A summary graph is produced for all conditions which can be quickly reviewed for anomalies. As illustrated in FIG. 6, the short term capability ratio Cp for certain conditions has dropped over time, indicating that a greater spread in distribution. This indicates that one or more units has drifted during the course of testing.

B. Parametric Variation Analysis

Figure 7:
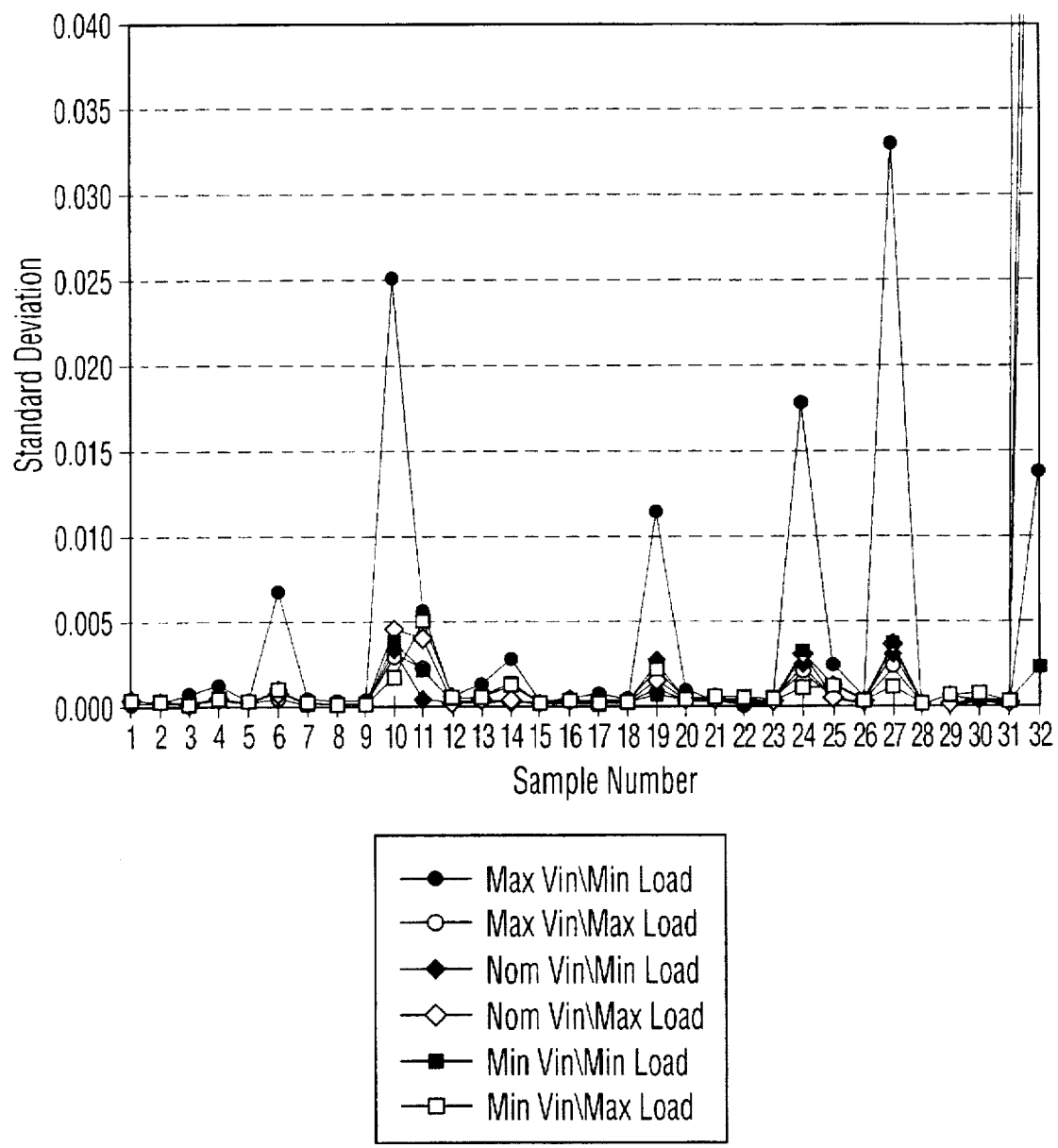
FIG. 7 illustrates examples of summary graph for input current deviation

Standard deviation is used to detect parametric variation of a repeated measurement for the same sample number, shown as $x_b$ in Table II. These values are plotted on a summary graph for all six line and load conditions to provide a clear visual indication of fault. Any unit displaying a high value for standard deviation relative to the other samples is considered questionable, and a candidate for full root cause analysis. It is important to plot all six line and load conditions. FIG. 7 illustrates how the magnitude of error can be much more pronounced at specific conditions. The high peaks seen at maximum input voltage/minimum load in FIG. 7 are units which suffered cracked transformer cores during the test program. This is a clear example of failure detection that would have been missed had not all operational conditions been tested and analyzed.

C. Performance Graphs

Figure 8:
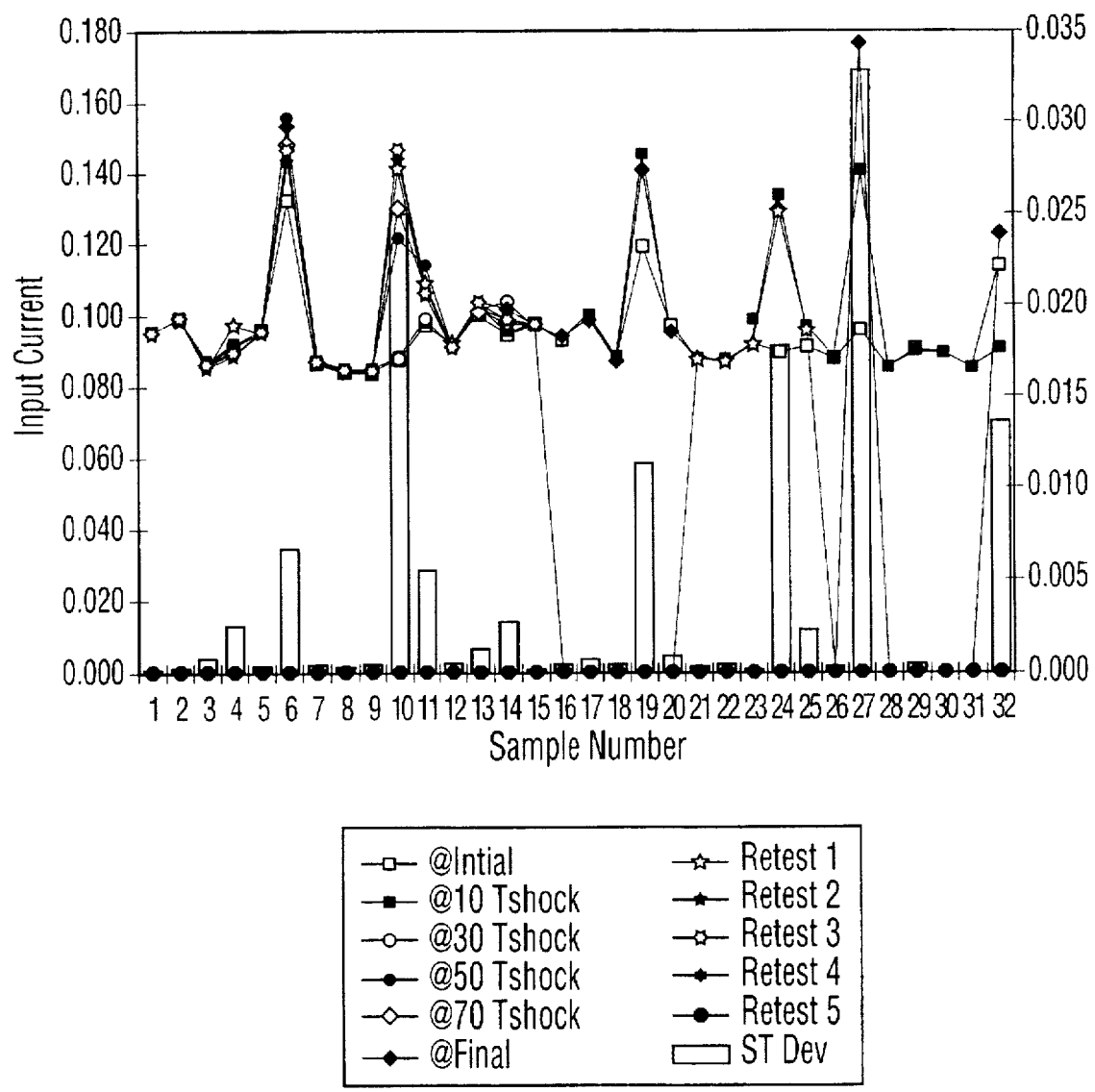
FIG. 8 illustrates examples of performance graph.

If a fault is indicated by the deviation or distribution analysis, the magnitude of the problem can be identified by examining a performance graph (FIG. 8). For example, the data in FIG. 6 indicates that the distribution spread of the test lot has increased during test. FIG. 7 indicates input current values of a number of units fluctuated, but does not give an indication of trend. The specific fault conditions can be identified by viewing a plot of the individual unit parameters. This plot provides a visual indicator of the trend and degree of the fault condition, and highlights units which may have drifted over time, as well as units which are significantly different as compared to the rest of the lot. Standard deviation is also plotted as a visual pointer. Any unit which has a high bar for standard deviation is considered suspect and returned to the supplier for full root cause analysis.

D. Distribution Histograms

Figure 9A:
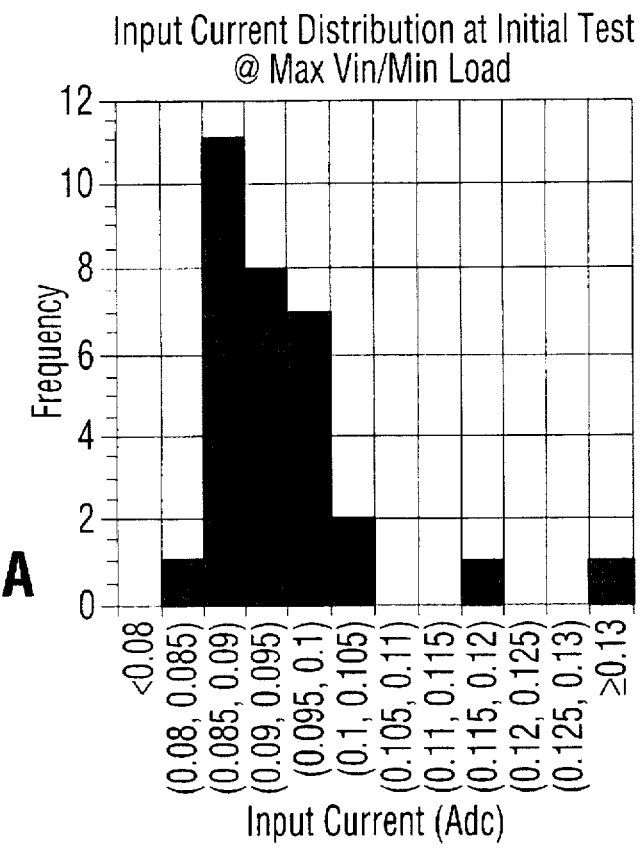
FIG. 9A illustrates distribution histogram at initial test.
Figure 9B:
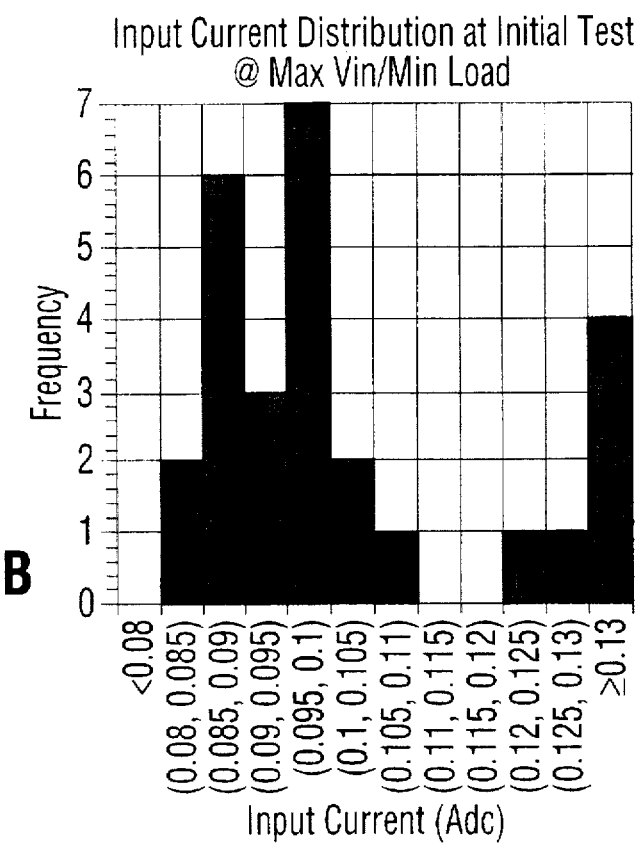
FIG. 9B illustrates distribution histogram at final test.

Histograms for efficiency, output voltage and input current are plotted as a final check, and assist in finding suspect "outliers", units which are significantly outside the normal distribution. Once again, the focus is to highlight any unit which has either shifted in performance, or is significantly different as compared to the test lot. Even if the parameter in question is within specification, the unit is still considered suspect because of it's variation from other units and returned for full root cause analysis. Histograms are plotted using the initial and final characterization data and compared as shown in FIGS. 9A and 9B.

V. Failure Analysis

A detailed failure analysis and identification of root causes for correction is critical to the effectiveness of any product qualification program. The qualification program must run as a closed loop, so that any reliability issues precipitated by this testing are identified and proper corrective actions implemented. The supplier of DC—DC converters is responsible for this key function, and must perform the failure analysis and implement any appropriate changes.

Any device which fails, be it a hard or soft failure, is returned to the supplier for root cause analysis. The supplier is asked the following basic questions; what failed, why did it fail, and what can be done to correct it. Often, care must be taken to ensure that the supplier performs a sufficiently detailed analysis and has adequately identified the root cause of the problem. For example, what could appear as a random component failure on initial examination could in fact be due to a particular component specification that was not adhered to. Occasionally, it is necessary to conduct failure analysis as a joint effort, with manufacturer's offering failure analysis lab facilities and expertise, and the manufacturer providing the design guidance. Full root cause analysis must look at all possible aspects related to the failure, such as design tolerance, process control, component lot variation, etc.

Ultimately, all failure issues must be explained. Corrective actions, including documented proof of implementation are developed. Further testing may be required to verify the effectiveness of the corrective actions, and may be conducted by the product manufacture or the supplier. The failure analysis process is carried out through a consultative and cooperative process, so that all parties are satisfied with the final outcome, with the end result being a more reliable product.

VI. Flow of the Testina Method

Figure 10:
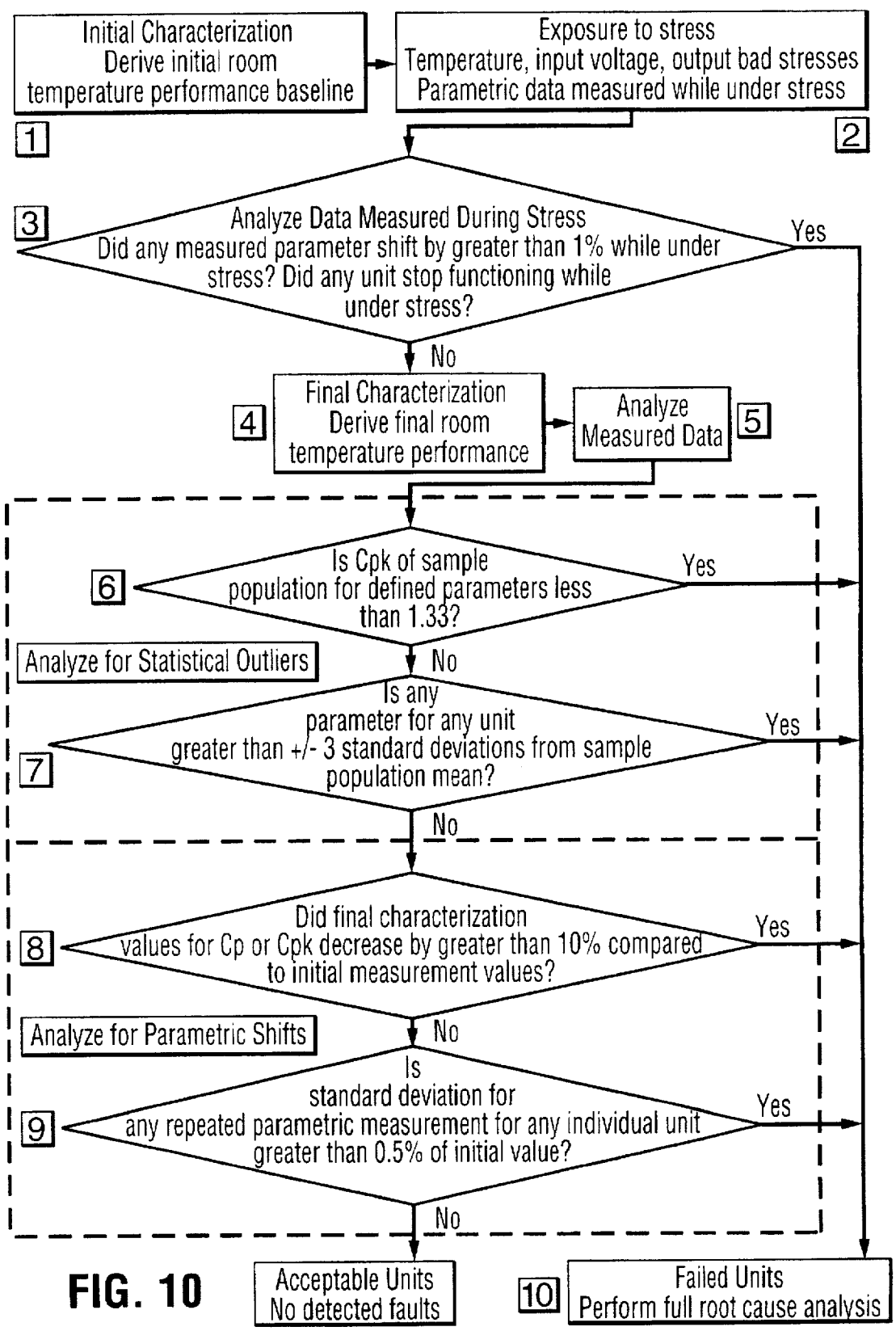
FIG. 10 is a flowchart of a testing process.

An entire process of the qualification testing of dc—dc converters is shown in FIG. 10. Referring to FIG. 10, each step of the process will be described below.

Step 1: Initial Characterization

Room temperature measurements of the devices are collected for key electrical parameters (input current, output voltage, startup voltage, shutdown voltage, short circuit current) as received from the supplier. All measurements are recorded electronically and tabulated in an Excel spreadsheet file. These initial measurements are used as a baseline, and are compared against later measurements for deltas (see Section III. Test Process, "A. Initial Characterization Test").

Step 2: Exposure to Stress

The devices are exposed to operational stress in the form of temperature cycling, input voltage cycling, output load cycling, vibration cycling and humidity exposure. These stresses are used to simulate extreme operating conditions so that an accelerated operating time period is achieved. At the same time, these stresses are not considered so excessive as to cause a device to fail, except in the case of step stress testing, which intentionally exceeds operating specification limits. All devices, with the exception of those exposed to step stress testing are expected to survive exposure to stress with no deviation in operating characteristics. Measurements data is collected and recorded on all tests involving active biasing of the device (see Section "III. Test Process", "B. Thermal Shock Test", "C. Power/Thermal Cycling Test", "D. Humidity Exposure Test" and "E. Step Stress Test".

Step 3: Analyze Data Measured During Stress

Data recorded while the devices were under exposure to stress is analyzed for any apparent fault that may only show up over the full operating temperature range. As well, any unit which is completely non-functional is identified (see Section "IV. Failure Detection", first paragraph).

Step 4: Final Characterization

Room temperature measurements as performed in section 1 are repeated. Data is tabulated in the running excel spreadsheet (see Section "III. Test Process", "A. Initial Characterization Test").

Step 5: Analyze Measured Data

Data collected during room temperature characterization is analyzed (see Section "V. Failure Analysis").

Step 6: Cpk Distribution Analyses

The data is anlayzed for centering and spread of the sample population relative to NPS specified limits using the short term and mid term capability ratios Cp and Cpk calculations (see Section "V. Failure Analysis", "A. Distribution Analysis" and "C. Performance Graphs").

Step 7: Statistical Outliers

Data for which no defined parameter (i.e., input current) exists are analyzed to identify outliers, which are units which stand out from the population (see Section "V. Failure Analysis", "A. Distribution Analysis", "C. Performance Graphs" and "D. Distribution Histograms).

Step 8: Cpk Drift Analysis

Before and after short term and mid term capability ratios Cp and Cpk values are compared for any negative shift in value, which indicates a change in parameters has taken place due to the environmental exposure (see Section "V. Failure Analysis", "A. Distribution Analysis" and "C. Performance Graphs").

Step 9: Standard Deviation Drift Analysis

Standard deviation is calculated for repeated measurements. High standard deviation indicates a variable reading or change in reading over the course of the test program (see Section "V. Failure Analysis", "B. Parametric Variation Analysis" and "C. Performance Graphs").

Step 10: Failure Analysis

All failed units are returned to the supplier for root cause failure analysis (see Section "V. Failure Analysis").

VII. Conclusions

The above described method is an effective method to evaluate the robustness and reliability of DC—DC converters from various suppliers in a cost effective and timely matter. Through accurate measurement techniques, environmental exposure and analysis of parametric data, defects are uncovered which directly relate to design, component, and manufacturing issues. Through root cause analysis and corrective action implementation these defects can be eliminated, thereby improving the device. By ensuring the reliability of the product supplied to the product manufacturer, the reliability of the products are enhanced.

What is claimed is:

1. A method of qualification testing of a group of DC—DC converters, comprising the steps of:

(1) testing operation performance of all of the DC—DC converters in the group, under condition of normal temperature;

(2) testing thermal coefficients of expansion of a certain number of the DC—DC converters tested at step (1), upon application of thermal shock;

(3) testing functionality of a certain number of the DC—DC converters tested at step (2), upon application of power and thermal cycling;

(4) testing design margin of a certain number of the DC—DC converters tested at step (2), under step changes in temperature; and (5) performing analysis using capability ratios to determine whether the failures of the group of the DC—DC converters are failed to be qualified, on the basis of short term and mid term capability ratios which are defined by upper and lower specification limits, mean and standard deviation.

2. The method of claim 1, further comprising the step of testing manufacturing flaws of a certain number of the DC—DC converters tested at step (2), under the conditions of biased humidity.

3. The method of claim 1, further comprising the step of testing the RF and/or audio emission of a certain number of the DC—DC converters tested at step (1).

4. The method of claim 1, further comprising the step of testing the short circuit protection of a certain number of the DC—DC converters tested at step (2).

5. The method of claim 1, wherein step (2) comprises the step of repeating air to air thermal shock at a specific number of cycles, the maximum and minimum test temperatures being specified.

6. The method of claim 1, wherein step (3) comprises the step of changing the test temperature at a specific ramp rate between specific minimum and maximum operating temperatures.

7. The method of claim 1, wherein step (4) comprises combined cycling of temperature, voltage, load and vibration.

8. The method of claim 1, wherein step (5) comprises the step of determining if the mid term capability ratio is less than a predetermined value, the group of the DC—DC converters will be failed.

9. The method of claim 8, wherein the predetermined value of the mid term capability ratio is 1.33, where the mid term capability ratio Cpk is given by:

$$Cpk=min[(USL-\mu/3\sigma), (\mu-LSL/3\sigma)]$$

where, USL, LSL, µ and σ are the upper specification limit, the lower specification limit, the mean and the standard deviation, respectively.

10. A method of qualification testing of a group of DC—DC converters, comprising the steps of:

(1) testing operation performance of all of the DC—DC converters the group, under the conditions of normal temperature;

(2) testing thermal coefficients of expansion of a certain number of the DC—DC converters tested at step (1), upon application of thermal shock;

(3) retesting thermal coefficients of expansion of a certain number of the DC—DC converters tested at step (2) at a specific number of cycling;

(4) testing functionality of a certain number of the DC—DC converters tested at step (2), upon application of power and thermal cycling;

(5) testing design margin of a certain number of the DC—DC converters tested at step (2), under step changes in temperature;

(6) testing manufacturing flaws of a certain number of the DC—DC converters tested at step (2), under the conditions of biased humidity;

(7) testing RF and/or audio emission of a certain number of the DC—DC converters tested at step (1);

(8) testing short circuit protection of a certain number of the DC—DC converters tested at step (2); and (9) performing analysis using capability ratios to determine whether the failures of the group of the DC—DC converters are failed to be qualified, on the basis of short term and mid term capability ratios which are defined by upper and lower specification limits, mean and standard deviation.

11. The method of claim 10, wherein step (9) comprises the step of determining if the mid term capability ratio is less than a predetermined value, the group of the DC—DC converters will be failed.

12. The method of claim 11, wherein the predetermined value of the mid term capability ratio is 1.33, where the mid term capability ratio Cpk is given by:

$$Cpk=min[(USL-\mu/3\sigma), (\mu-LSL/3\sigma)]$$

where, USL, LSL, µ and σ are the upper specification limit, the lower specification limit, the mean and the standard deviation, respectively.

* * * * *